(12) United States Patent
Shojo et al.

(10) Patent No.: US 9,799,483 B2
(45) Date of Patent: Oct. 24, 2017

(54) CHARGED PARTICLE BEAM DEVICE AND DETECTION METHOD USING SAID DEVICE

(71) Applicant: HITACHI HIGH-TECHNOLOGIES CORPORATION, Minato-ku, Tokyo (JP)

(72) Inventors: Tomoyasu Shojo, Tokyo (JP); Hajime Kawano, Tokyo (JP); Yasunari Sohda, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/306,977

(22) PCT Filed: Apr. 21, 2015

(86) PCT No.: PCT/JP2015/062056
§ 371 (c)(1),
(2) Date: Oct. 26, 2016

(87) PCT Pub. No.: WO2015/174221
PCT Pub. Date: Nov. 19, 2015

(65) Prior Publication Data
US 2017/0053777 A1  Feb. 23, 2017

(30) Foreign Application Priority Data
May 13, 2014  (JP) .................. 2014-099902

(51) Int. Cl.
*H01J 37/28* (2006.01)
*H01J 37/09* (2006.01)
(Continued)

(52) U.S. Cl.
CPC .............. *H01J 37/12* (2013.01); *H01J 37/09* (2013.01); *H01J 37/10* (2013.01); *H01J 37/147* (2013.01);
(Continued)

(58) Field of Classification Search
USPC ..... 250/306, 307, 309-311, 396 R, 396 ML, 250/397, 399, 442.11, 492.1, 492.2,
(Continued)

(56) References Cited

U.S. PATENT DOCUMENTS 4,963,737 A  10/1990 Suzuki
6,680,481 B2 *  1/2004 Okino ................. H01J 37/3045
                                                          250/491.1
(Continued)

FOREIGN PATENT DOCUMENTS

JP       1-319237 A    12/1989
JP    2001-74437 A     3/2001
(Continued)

OTHER PUBLICATIONS

Office Action dated Nov. 7, 2016 for related Taiwanese Application No. 104113576.

*Primary Examiner* — Bernard Souw
(74) *Attorney, Agent, or Firm* — Miles & Stockbridge P.C.

(57) ABSTRACT

In the present invention, a charged particle beam device has a charged particle source (1), a first condenser lens (4) arranged downstream from the charged particle source (1), an aperture (5) arranged downstream from the first condenser lens (4), and a second condenser lens (6) arranged downstream from the aperture (5), wherein, when a sample (12) is to be irradiated at a second charged particle beam amount which is greater than a first charged particle beam amount, the first and second condenser lenses are controlled such that a charged particle beam is formed downstream from the aperture (5), and such that the focal point of the second condenser lens does not vary between the first charged particle beam amount and the second charged particle beam amount.

15 Claims, 10 Drawing Sheets

(51) Int. Cl.
  *G01N 23/225* (2006.01)
  *H01J 37/12* (2006.01)
  *H01J 37/10* (2006.01)
  *H01J 37/147* (2006.01)

(52) U.S. Cl.
  CPC ......... *H01J 37/28* (2013.01); *H01J 2237/103* (2013.01); *H01J 2237/24592* (2013.01); *H01J 2237/28* (2013.01)

(58) Field of Classification Search
  USPC ................................ 250/492.21, 492.11, 526
  See application file for complete search history.

(56) References Cited

U.S. PATENT DOCUMENTS

| | | | |
|---|---|---|---|
| 6,835,511 B2* | 12/2004 | Hirayanagi | G03F 1/84 250/491.1 |
| 6,894,291 B2* | 5/2005 | Okino | B82Y 10/00 250/492.1 |
| 6,917,048 B2* | 7/2005 | Fujiwara | B82Y 10/00 250/492.2 |
| 2003/0077530 A1* | 4/2003 | Fujiwara | B82Y 10/00 430/30 |
| 2003/0089863 A1* | 5/2003 | Hirayanagi | B82Y 10/00 250/492.2 |
| 2003/0111618 A1* | 6/2003 | Udagawa | B82Y 10/00 250/492.22 |
| 2015/0076349 A1* | 3/2015 | Sasajima | H01J 37/265 250/310 |
| 2015/0179394 A1 | 6/2015 | Saito et al. | |

FOREIGN PATENT DOCUMENTS

| | | |
|---|---|---|
| JP | 2004-342628 A | 12/2004 |
| JP | 2006-78591 A | 3/2006 |
| JP | 2013-251088 A | 12/2013 |
| WO | 2013/179808 A1 | 12/2013 |

* cited by examiner

Fig. 11

Inspection recipe condition setting screen

Common observation condition

- Acceleration voltage
- Focal point position of second condenser lens
- Observation magnification (FOV) ( )
- Pixel size First observation region | Second observation region
Third observation region SEM observation image Individual observation condition Third observation region
Second observation region
First observation region

- Coordinates
- Electron dose
- Number of added images

Calculation process

CHARGED PARTICLE BEAM DEVICE AND DETECTION METHOD USING SAID DEVICE

TECHNICAL FIELD

The present invention relates to an inspection technique for inspecting a fine circuit pattern or the like by using a charged particle beam.

BACKGROUND ART

A charged particle beam apparatus includes a semiconductor inspection apparatus such as a length measurement electron microscope to which a scanning electron microscope is applied. The semiconductor inspection apparatus controls an object point position of an objective lens with high accuracy in order to obtain a stable inspection result, and thus obtains an accurate display magnification. This is so that deflection sensitivity of a scanning deflector and an optical magnification of the objective lens which depend on an object point position of the objective lens are set with high accuracy.

On the other hand, the semiconductor inspection apparatus is required to irradiate a circuit pattern with an electron dose corresponding to the circuit pattern to be inspected. For example, in a length measurement electron microscope, a circuit pattern made of a resist material or the like is irradiated with an electron beam of several pA for the purpose of low damage, and a circuit pattern having a three-dimensional structure, such as a trench portion, is irradiated with an electron beam of several nA for the purpose of an increase of a signal amount.

Meanwhile, PTL 1 discloses a charged particle beam apparatus which can obtain an inspection result with good stability and reproducibility even in a case where inspection is performed by changing an optical condition (in a case where an electron dose is changed by using a set value for an electron gun power source). PTL 1 discloses that "a current limiting diaphragm 17 is disposed between a focusing lens 8 and a crossover position 10", and "the excitation intensity of the focusing lens 8 is controlled so that a ratio between an amount of currents (Ip) applied to a sample 12 through the current limiting diaphragm 17 and a total current amount (Ia+Ip) is constant, and thus the crossover position 10 is constant".

PTL 2 discloses a circuit pattern inspection apparatus which inspects a foreign substance on a wafer by using an electron beam in a manufacturing process of a semiconductor device. PTL 2 discloses a method in which a sample is scanned with an electron beam in a relatively small area, with a relatively small current, and at a relatively low speed, and discloses a method "in which aberration of an optical system, or a factor to hinder convergence of an electron beam, called an coulomb effect is minimized so that a minute beam is formed, by reducing an electron beam current more than when a defect detection inspection is performed, and thus a high resolution is obtained", and "the method in which a magnification of the optical system is changed by changing a focal length of a lens, and thus an opening angle of a beam is reduced without moving a diaphragm". PTL 2 also discloses that "it is possible to move a crossover position to a position over the diaphragm and also to improve a resolution by making the intensity of a condenser lens greater than when defect detection inspection is performed", and "since b is smaller and c is larger than when defect detection inspection is performed, and thus a magnification is reduced; and an irradiation angle β can be reduced".

PTL 3 discloses an electron beam exposure apparatus and an electron beam exposure method in which a variation in an electron beam is suppressed. PTL 3 discloses that "the electron beam 3 having passed through the shaping aperture 7 is incident to the projection lens 8; the projection lens 8 is driven by the projection lens craving unit 35; the projection lens 8 focuses the incident parallel electron beam 3; the focused electron beam 3 is formed at a crossover position; and the blanking aperture 10 is disposed at the crossover position, and the blanking electrode 9 is disposed between the projection lens 8 and the crossover position (that is, a position of the blanking aperture 10)", and "in the example illustrated in FIG. 3, the current limiting aperture 5 is located between the crossover of the electron beam 3 and the irradiation lens 6, but the invention is not limited thereto, and may be located between the condenser lens 4 and the crossover of the electron beam 3".

CITATION LIST

Patent Literature

PTL 1: JP-A-2004-342628
PTL 2: JP-A-2001-074437
PTL 3: JP-A-2006-078591

SUMMARY OF INVENTION

Technical Problem

PTL 1 discloses the charged particle beam apparatus which can obtain an inspection result with good stability and reproducibility even in a case where inspection is performed by changing an optical condition. However, in the charged particle beam apparatus disclosed in PTL 1, it is necessary to perform control so that an optical magnification is constant. Thus, a crossover position of the focusing lens is required to be constant, and thus it is not taken into consideration that an amount of charged particle beams applied to a sample is made to be relatively large.

PTL 2 discloses the circuit pattern inspection apparatus which inspects a foreign substance on a wafer by using an electron beam in a manufacturing process of a semiconductor device. However, in the circuit pattern inspection apparatus disclosed in PTL 2, in a case where a sample is scanned with a relatively small current, it is necessary to change a magnification of the optical system by changing a focal length of the lens. Thus, a crossover position of the condenser lens is required to be changed, and thus it is not taken into consideration that a current is controlled without changing a focal length of the objective lens.

PTL 3 discloses the electron beam exposure apparatus and the electron beam exposure method in which a variation in an electron beam is suppressed. However, the electron beam exposure apparatus disclosed in PTL 3 requires an irradiation lens which collimates an electron beam, a projection lens which focuses the collimated electron beam, and a focus correction lens which focuses the electron beam on a sample. In the electron beam exposure apparatus, the electron beam is required to be focused on the sample by adjusting the focus correction lens, and thus the focus correction lens and an objective lens may be substantially regarded as an integrated lens. Therefore, it is not taken into consideration that an electron dose is control led without changing a focal length of the focus correction lens and the objective lens. Thus, in a case where an amount of an electron beam applied to a sample is relatively increased, an opening angle of an electron beam is relatively increased.

Therefore, in light of the above-described problems, the present inventor realizes providing a charged particle beam apparatus which can control an objective opening angle to be smaller than in the related art in a case where a sample is irradiated with a relatively large charged particle dose, without providing a new focus correction lens or changing a focal length of an objective lens which focuses a charged particle beam on the sample.

Solution to Problem

In order to solve the problems, for example, the configurations disclosed in the claims are employed. The present specification includes a plurality of means for solving the above-described problems, but, as an example thereof, there is provided a charged particle beam apparatus "including a charged particle source; a first condenser lens that is provided on a downstream side of the charged particle source; a diaphragm that is provided on a downstream side of the first condenser lens; a second condenser lens that is provided on a downstream side of the diaphragm; an objective lens that is provided on a downstream side of the second condenser lens; a detector that detects an information signal generated from a sample due to irradiation with a charged particle beam; and a controller that controls the first and second condenser lenses so that a charged particle beam is imaged on the downstream side of the diaphragm in a case where the sample is irradiated with a second charged particle dose larger than a first charged particle dose, and a focal point position (an object point of the objective lens) of the second condenser lens is not changed at the first charged particle dose and the second charged particle dose".

As an example of the invention, there is provided an inspection method "for a charged particle beam apparatus including a charged particle source; a first condenser lens that is provided on a downstream side of the charged particle source; a diaphragm that is provided on a downstream side of the first condenser lens; a second condenser lens that is provided on a downstream side of the diaphragm; an objective lens that is provided on a downstream side of the second condenser lens; a detector that detects an information signal generated from a sample due to irradiation with a charged particle beam; and a controller, the method including causing the controller to perform a process of controlling the first and second condenser lenses so that a charged particle beam is imaged on the downstream side of the diaphragm in a case where the sample is irradiated with a second charged particle dose larger than a first charged particle dose, and a focal point position of the second condenser lens is not changed at the first charged particle dose and the second charged particle dose".

Advantageous Effects of Invention

According to the invention, it is possible to implement a charged particle beam apparatus which can control an objective opening angle to be smaller than in the related art in a case where a sample is irradiated with a relatively large charged particle dose without providing a new focus correction lens or changing a focal length of an objective lens which focuses a charged particle beam on the sample. Objects, configurations, and effects other than those described above will become apparent through description of the following embodiments.

BRIEF DESCRIPTION OF DRAWINGS

FIG. 11 is a diagram schematically illustrating an inspection recipe condition setting screen.

DESCRIPTION OF EMBODIMENTS

Hereinafter, with reference to the drawings, embodiments of the invention will be described. An embodiment of the invention is not limited to embodiments described below, and may be variously modified within the scope of the technical spirit.

First Embodiment

Figure 1:
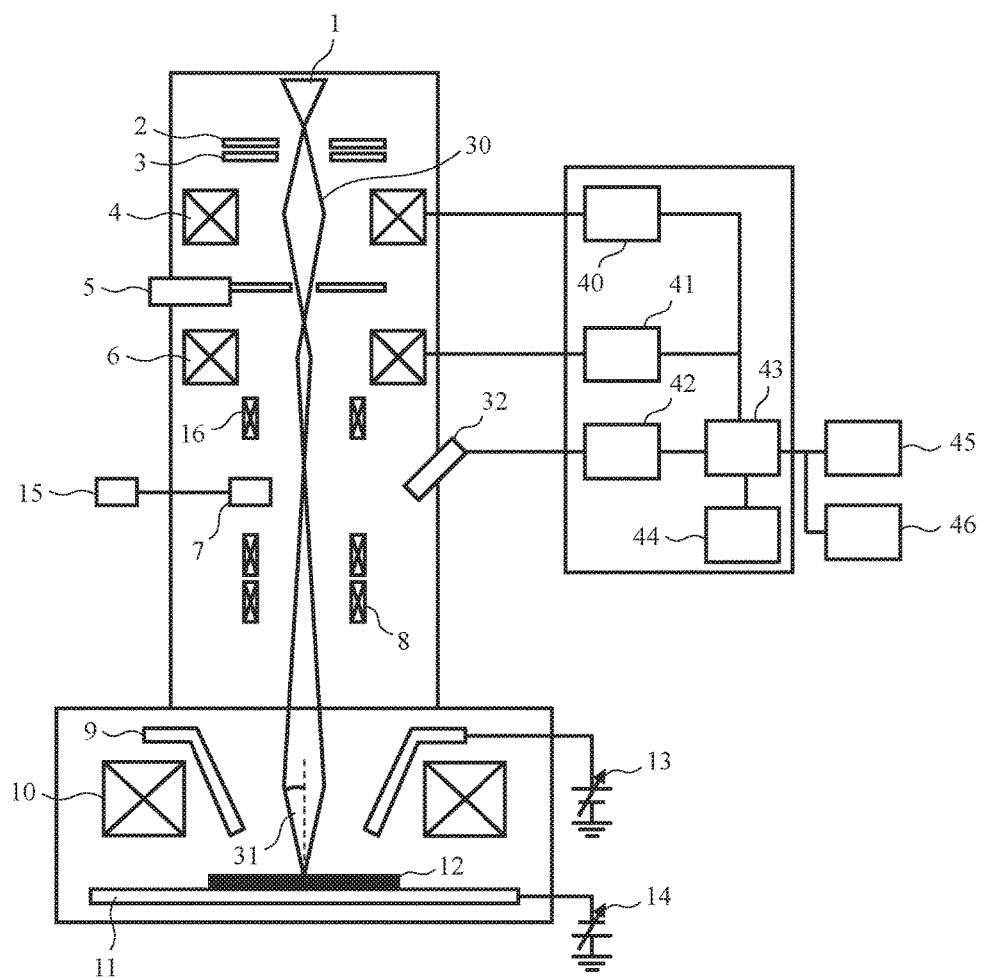
FIG. 1 is a diagram for explaining a schematic configuration of a charged particle beam apparatus according to a first embodiment and an optical trajectory in a case where the apparatus performs irradiation with an electron beam having a relatively large current amount.

FIG. 1 illustrates a schematic configuration of a charged particle beam apparatus according to a first embodiment. The charged particle beam apparatus illustrated in FIG. 1 includes a charged particle source 1, extraction electrodes 2 which extract a charged particle beam 30 from the charged particle source 1, and acceleration electrodes 3 which accelerate the charged particle beam 30. In the present embodiment, for example, an electron source is used as the charged particle source 1. In this case, the charged particle beam 30 is an electron beam.

The charged particle beam apparatus includes a condenser lens 4 (first condenser lens) which focuses the charged particle beam 30; a lens setting unit 40 which drives the condenser lens 4; a condenser lens 6 (second condenser lens) which is provided further toward a downstream side than the condenser lens 4 and focuses the charged particle beam 30; a lens setting unit 41 which drives the condenser lens 6; and a diaphragm 5 which is provided between the condenser lens 4 and the condenser lens 6 and restricts the charged particle beam 30 incident to a sample 12. A deflector 16 used to deflect the charged particle beam 30 is disposed on the downstream side of the condenser lens 6.

The charged particle beam apparatus includes a scanning deflector 8 which scans the sample 12 with the charged particle beam 30; an objective lens 10 which focuses the charged particle beam 30 on the sample 12; upper magnetic poles 9 which are one of components forming the objective lens 10; and a sample stand 11 on which the sample 12 is placed. The upper magnetic poles 9 place a voltage power source 13 which can vary a voltage, and the sample stand 11 is connected to a voltage power source 14 which can vary a voltage to be applied. The charged particle beam apparatus also includes a secondary signal detector 32 which detects a secondary signal generated from the sample 12 due to irradiation with the charged particle beam 30; a signal processing unit 42 which processes the detected signal so as to form an image; and a control/calculation unit 43 which is connected to the signal processing unit 42.

The control/calculation unit 43 is connected to a storage device 44, an input unit 45, and an image display unit 46. The control/calculation unit 43 is connected to the above-described lens setting units 40 and 41, and outputs control values used for control of each unit. The charged particle beam apparatus also includes a Faraday cup 7 which is provided on the downstream side of the diaphragm 5 in order to measure an amount of an electron beam applied to the sample 12, and an ammeter 15 connected to the Faraday cup 7.

Hereinafter, the charged particle beam apparatus is assumed to be a length measurement electron microscope (hereinafter, referred to as a "length measurement SEM") to which a scanning electron microscope (hereinafter, referred to as an "SEM") is applied. The length measurement SEM is a semiconductor inspection apparatus which measures a dimension (hereafter, referred to as a "pitch") of a circuit pattern.

In the length measurement SEM, an electron beam (charged particle beam 30) which is emitted from an electron source (charged particle source 1) and is accelerated is shaped by diaphragm 5, and then the electron beam is focused so as to be thinly narrowed by the objective lens 10. The length measurement SEM scans the sample 12 with the thinly narrowed electron beam by using the scanning deflector 8. The length measurement SEM detects a secondary signal generated from the sample 12 due to irradiation with the electron beam with the detector 32, and displays the intensity of the detected signal on the image display unit 46 as an observation image.

Typically, a diffusion replenishment type thermal field emission electron source is used as the electron source. A voltage is applied to the extraction electrodes 2, and thus the electron beam is extracted from the electron source. A negative voltage (hereinafter, referred to as a "voltage V0") is applied to the acceleration electrodes 3, and the electron beam passes through the acceleration electrodes 3 with energy of V0. Thereafter, the electron beam is focused by the condenser lens 4, and an electron dose is restricted when the electron beam passes through the diaphragm 5. The electron beam having passed through the diaphragm 5 is focused by the condenser lens 6.

The sample stand 11 is provided with the voltage power source 14 which can vary a voltage in order to apply an electron beam deceleration voltage (hereinafter, referred to as "voltage Vr"). The electron beam is rapidly decelerated over the sample 12 (hereinafter, also referred to as a "wafer" or a "substrate to be inspected") mounted on the sample stand 11 due to the voltage Vr. The decelerated electron beam is focused on the sample 12 by the objective lens 10. The scanning deflector 8 which is typically formed in two stages is disposed between the condenser lens 6 and the objective lens 10. An upper surface of the sample 12 is scanned with the electron beam by the scanning deflector 8.

The energy of the electron beam while being applied to the sample 12 corresponds to a difference between the voltages V0 and Vr. In the present embodiment, the voltage V0 is assumed to be 5 kV, and the voltage Vr is assumed to be −4 kV. In this case, the electron beam having the energy of 1 keV is applied to the sample 12. Due to irradiation with the electron beam, a secondary signal is generated from the sample 12.

The upper magnetic poles 9 of the objective lens 10 is provided with the voltage power source 13 which can vary a voltage in order to apply a voltage (hereinafter, referred to as a "voltage Vb") for raising a secondary signal. In the present embodiment, the voltage Vb is assumed to be 10 kV. The secondary signal generated from the sample 12 is pulled up toward the electron source side from the upper magnetic poles 9 so as to be detected by the detector 32 due to the voltage Vb. The detected signal in the detector 32 is sent to the control/calculation unit 43 via the signal processing unit 42, and is displayed on the image display unit 46 as a scanned SEM image. The deflector 16 provided between the diaphragm 5 and the Faraday cup 7 located on the downstream side thereof deflects the electron beam having passed through the diaphragm 5, so as to irradiate the electron beam with the Faraday cup 7, and thus an electron dose is measured by the ammeter 15 connected to the Faraday cup 7.

An example of the sample 12 may include a circuit pattern having a three-dimensional structure. The circuit pattern is a pattern having a groove, and also includes a circuit pattern in which an aspect ratio (hereinafter, referred to as an "AR") indicating a ratio between a width of a groove and a depth of the groove is 30 or more. It is known that, when a secondary signal from the groove goes up to an upper surface, the secondary signal collides with a sidewall, and thus an amount of the signal is considerably reduced. It is known that, among secondary signals, a high energy signal hardly collides with the sidewall, but a generation amount of the signal is smaller than that of a low energy signal. Thus, the importance of an observation method of setting an amount of electrons to be applied to be 100 times or more than in the related art has been increasing in order to observe a groove having a high AR at high S/N.

However, in a method of the related art for increasing a probe current, if an electron dose is increased while controlling the condenser lens 6 so as not to change a focus of the objective lens 10, an opening angle 31 (hereinafter, also referred to as an "objective opening angle" or an "opening angle") of an electron beam focused by the objective lens 10 is increased, and thus a focal depth and a resolution deteriorate. This is because a focal depth is inversely proportional to an objective opening angle, and a chromatic aberration of the objective lens 10 increases in proportion to the objective opening angle. If the objective opening angle is large, in a sample having a high AR, some of electron beams are deviated from (or collide with) an upper part of a groove, thus the number of electrons reaching a groove bottom is reduced, and this leads to deterioration of S/N.

Here, a description will be made of a method of increasing an amount of an electron beam applied to the sample 12.

(1) A first method is a method of increasing a voltage of the extraction electrodes 2, and increasing the density of currents extracted from the electron source (charged particle source 1). However, in this method, an effective control range of the current density is smaller than 100 times due to a withstanding voltage of an electron gun, and an energy distribution amount of the electron source increases according to the current density, and thus there is a problem in that a chromatic aberration of the objective lens 10 is increased, and therefore a resolution deteriorates.

Figure 2:
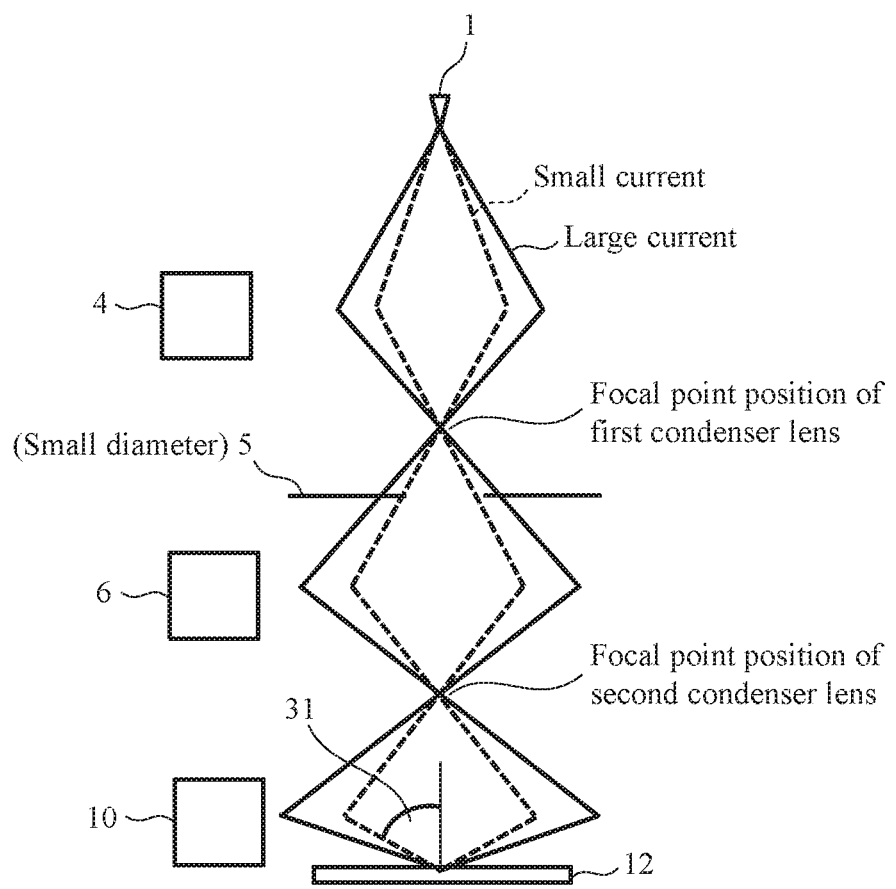
FIG. 2 is a diagram for explaining an optical trajectory in a case where a diameter of a diaphragm is small (comparative example).
Figure 3:
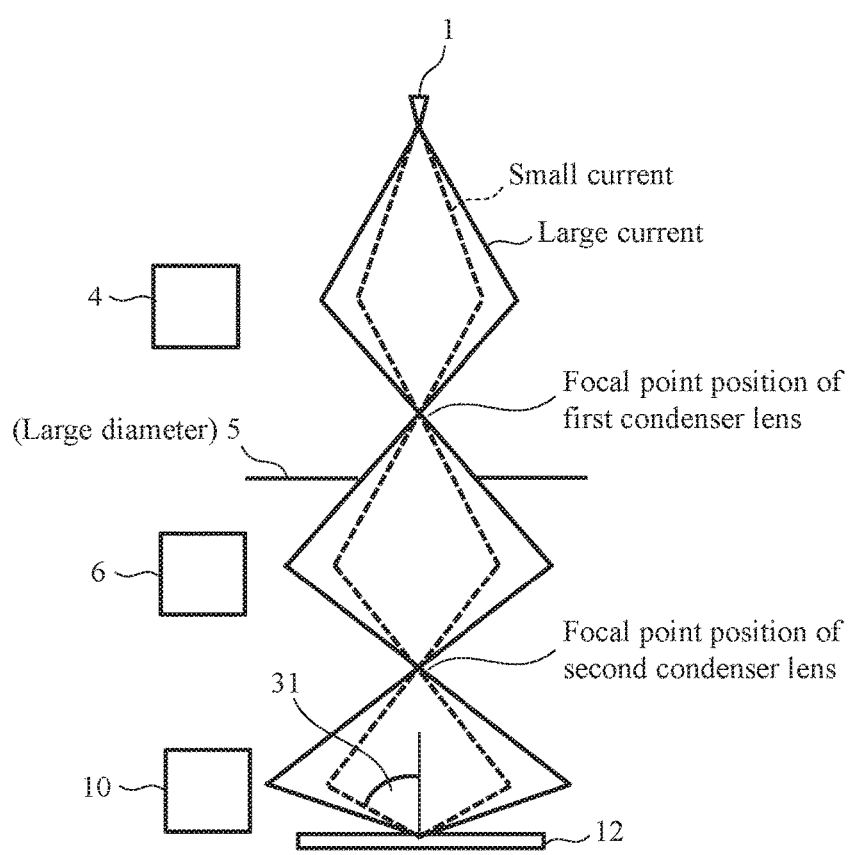
FIG. 3 is a diagram for explaining an optical trajectory in a case where a diameter of the diaphragm is large (comparative example).

(2) A second method is a method of replacing the diaphragm 5 with a diaphragm having a large aperture. FIG. 2 illustrates an optical trajectory in a case where a diameter of a hole of the diaphragm 5 is small, and FIG. 3 illustrates an optical trajectory in a case where a diameter of a hole of the diaphragm 5 is large. As illustrated in FIG. 2, in a case where a relatively small electron dose is obtained, a diaphragm having a relatively small diameter (small diameter) may be used. In this case, the whole of the optical trajectory of a small current passes through the hole of the diaphragm 5, but only a part of the optical trajectory of a large current passes through the hole of the diaphragm 5. On the other hand, as illustrated in FIG. 3, in a case where a relatively large electron dose is obtained, a diaphragm having a relatively large diameter may be used. In this case, the whole of the optical trajectory of the large current also passes through the hole of the diaphragm 5. However, in this method, if a diameter of the hole of the diaphragm 5 is increased, there is a problem in that the objective opening angle 31 increases depending on a size thereof, and the diaphragms 5 are prepared so as to correspond to a desired electron dose, and the diaphragm 5 is replaced according to the magnitude of an electron dose to be used.

As method of replacing the diaphragm 5 with a diaphragm having a large diameter, for example, there are following methods.

(2-1) A method in which two or more diaphragms 5 having different diameters are prepared, and the diaphragm is replaced with a diaphragm having a desired diameter (2-2) A method in which a diaphragm having a desired diameter is selected by using a diaphragm switching portion provided with a single diaphragm having two or more holes whose diameters are different from each other and a moving mechanism transporting the diaphragm (2-3) A method in which a diaphragm having a desired diameter is selected by deflecting an electron beam by using a single diaphragm having two or more holes whose diameters are different from each other and an alignment deflector provided on an upstream side of the diaphragm.

(3) A third method is a method of increasing an optical magnification by changing a focal length of the condenser lens 4 located on the upstream side of the diaphragm 5. This case will be described with reference to FIG. 4. In order to obtain a relatively large electron dose, an optical magnification may be increased by making a focal point position of the condenser lens 4 close to the diaphragm 5. In this case, it can be seen that a large current passes through the hole of the diaphragm 5. This method is superior to the above-described first method in that a control range of the current density is equal to or more than 100 times, and energy distribution of the electron source (charged particle source 1) is not increased, and thus a chromatic aberration of the objective lens 10 is not increased.

Meanwhile, in the length measurement SEM, in order to obtain an accurate display magnification, a focal point position of the condenser lens 6 (second condenser lens) which is an object point position of the objective lens 10 is required to be controlled with high accuracy. This is so that deflection sensitivity or the scanning deflector and an optical magnification of the objective lens 10 which depend on an object point position of the objective lens 10 are set with high accuracy.

In the length measurement SEM which measures a pitch between patterns on the basis of a display magnification, information regarding control parameters such as the deflection sensitivity or the scanning deflector or an optical magnification of the objective lens 10 corresponding to a focal point position of the condenser lens 6 (second condenser lens) is stored in the storage device 44. Here, the storage device stores a relationship between a control value of the condenser lens 4 (first condenser lens) and a control value of the condenser lens 6 (second condenser lens) for causing a focal point position of the condenser lens 6 (second condenser lens) to be constant, in the form of a function or a table.

The control/calculation unit 43 connected to the storage device 44 refers to, for example, the storage device 44 so as to obtain control values of the second condenser lens corresponding to control values of the first condenser lens, and outputs the control values to the lens setting units 40 and 41. Here, the control values of the first condenser lens are determined depending on an electron dose which is used during observation. In this case, the control values of the second condenser lens are obtained, for example, by assigning the control values of the first condenser lens to a function, or by retrieving a table in which the control values of the first condenser lens and the control values of the second condenser lens are recorded, with the control values of the first condenser lens.

In a case where a control value of the second condenser lens corresponding to a control value of the first condenser lens is correlated with an electron dose or an optical mode which will be described later, the control/calculation unit 43 connected to the storage device 44 obtains the control value of the first condenser lens and the control value of the second condenser lens corresponding to the electron dose or the optical mode, and outputs the control values to the lens setting units 40 and 41.

In the present specification, a control parameter group is collectively referred to as an optical mode. A focal point position of the condenser lens 6 (second condenser lens) is used to control an opening angle of the objective lens 10, and the storage device 44 stores an optical mode such as a high resolution optical mode in which a resolution is prioritized, or a focal depth optical mode in which a focal depth is prioritized.

Generally, the length measurement SEM has a problem that adjustment parameters are required to be provided by the number of optical modes, the adjustment time is very long, and thus it is necessary to switch control parameters in order to use other optical modes. The length measurement SEM also has a problem that only a single optical mode can be designated in a file (hereinafter, referred to as an "inspection recipe") for designating conditions for the SEM, such as an acceleration voltage or an electron dose.

In the length measurement SEM, a circuit pattern is required to be irradiated with an electron dose corresponding to the circuit pattern to be inspected. For example, an electron dose of several pA is necessary in inspection of a circuit pattern made of a resist material or an insulating material in which low damage or suppression of charging is required. For example, an electron dose of several nA is necessary in inspection of a circuit pattern having a three-dimensional structure, such as a trench portion in which an increase in a signal amount is required. In a case where the above-described circuit patterns are mixed in the sample 12, if the same inspection recipe is to be used, it is necessary that a focal point position of the condenser lens 6 is the same (is not changed) even if an electron dose differs.

Figure 4:
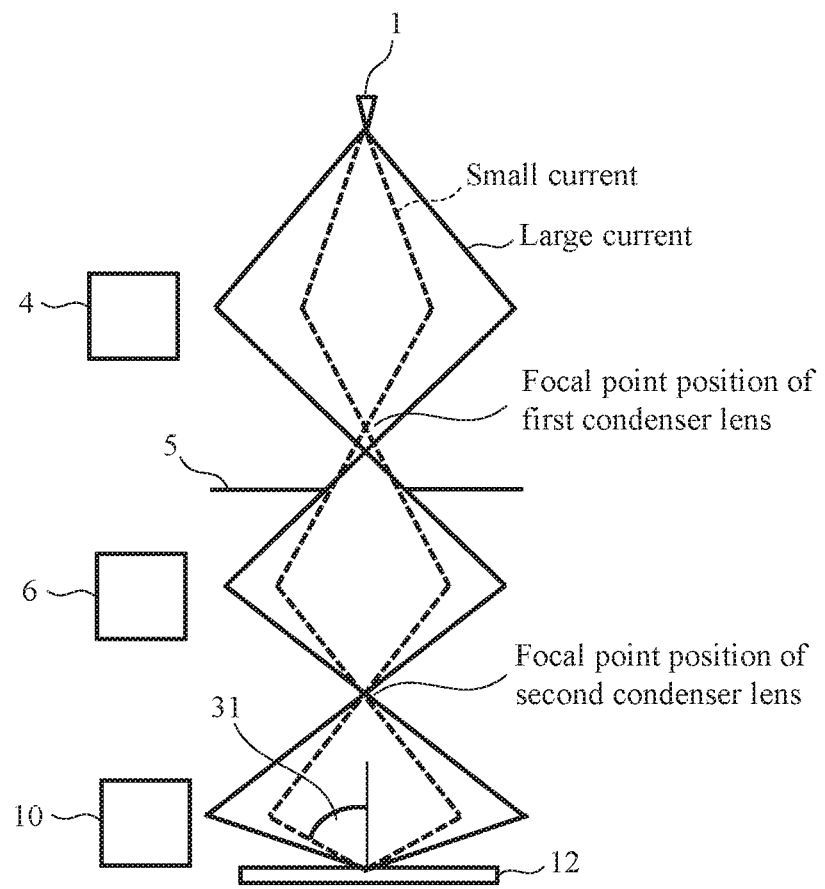
FIG. 4 is a diagram for explaining an optical trajectory in a case where an optical magnification is controlled (comparative example).

With reference to FIG. 4, a description will be made of a problem in a case where an electron dose is increased by controlling an optical magnification. In FIG. 4, an optical trajectory in a case of obtaining a relatively small electron dose in the length measurement SEM (a case of a small current) is indicated by dashed lines. In a case of FIG. 4, a focal point position of the condenser lens 4 (first condenser lens) is located over the diaphragm 5, and a focal point position of the condenser lens 6 (second condenser lens) is set so that the opening angle 31 of the objective lens 10 is made suitable.

In FIG. 4, solid lines indicate an optical trajectory in a case where control is performed so that a focal point position of the condenser lens 6 (second condenser lens) at a large current is the same as a focal point position at a small current. In a case where a relatively large electron dose is to be obtained, as illustrated in FIG. 4, an opening angle at which the diaphragm 5 is oriented from the focal point position of the condenser lens 4 (first condenser lens) increases. Thus, if the focal point position of the condenser lens 6 (second condenser lens) at the large current is made to match a focal point position at the small current, there is a problem in that the opening angle 31 of the objective lens 10 is increased as a result.

Therefore, in the length measurement SEM of the present embodiment, the optical trajectory illustrated in FIG. 1 is employed so that an increase of the opening angle 31 of an electron beam passing through the objective lens 10 is suppressed even in a case where a relatively large electron dose is to be obtained. In other words, in a case where a relatively large electron dose is to be obtained, a focal point position of the condenser lens 4 (first condenser lens) is controlled to be located on the downstream side of the diaphragm 5. In the length measurement SEM of the present embodiment, in a case where a relatively small electron dose is to be obtained, as illustrated in FIG. 5, a focal point position of the condenser lens 4 (first condenser lens) is control led to be located on the upstream side of the diaphragm 5, and a focal point position of the condenser lens 6 (second condenser lens) is also control led so that a desired objective opening angle is obtained.

Figure 5:
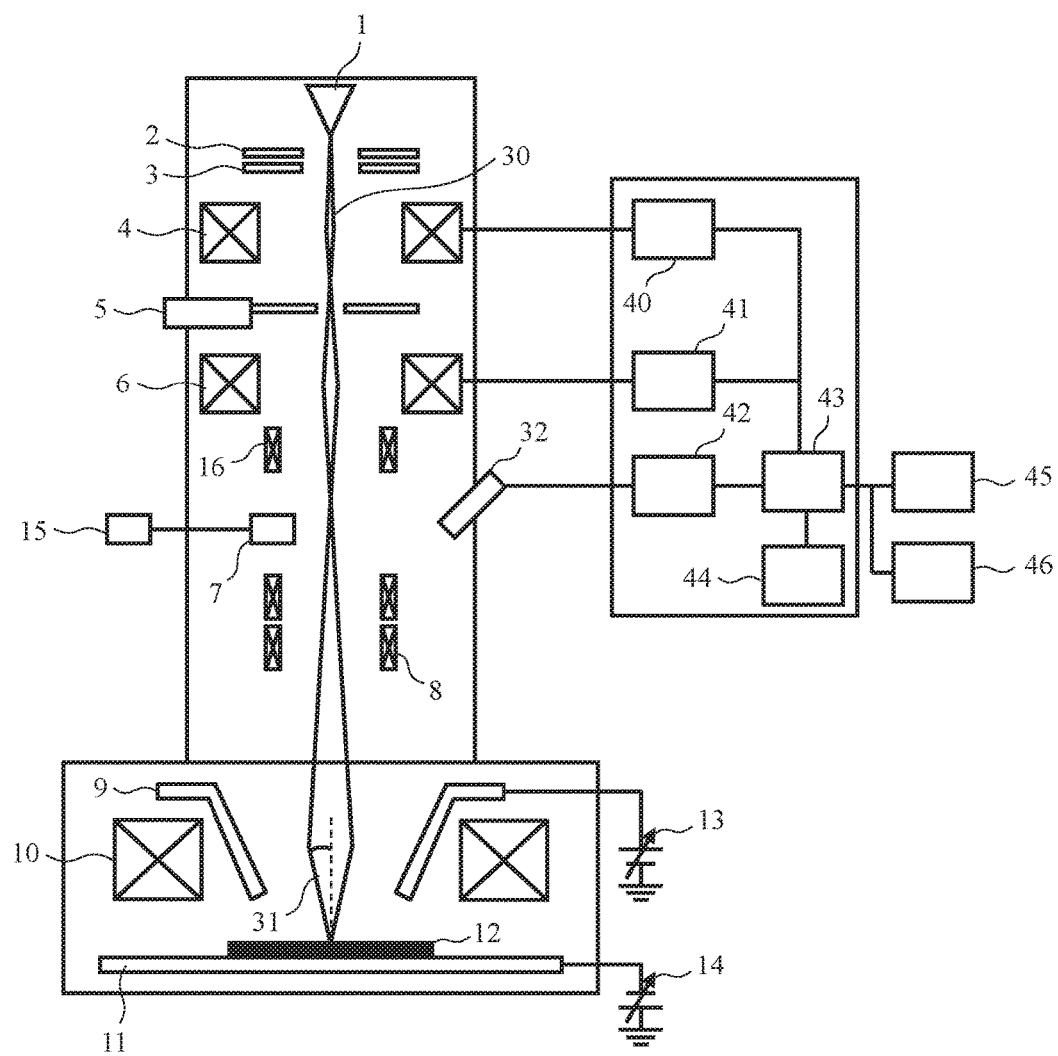
FIG. 5 is a diagram for explaining a schematic configuration of the charged particle beam apparatus according to the first embodiment, and an optical trajectory in a case where the apparatus performs irradiation with an electron beam having a relatively small current amount.

The length measurement SEM of the present embodiment performs control so that a focal point position (objective object point) of the condenser lens 6 (second condenser lens) in a case where a relatively large electron dose is to be obtained (FIG. 1) is the same as a focal point position (objective object point) of the condenser lens 6 in a case where a relatively small electron dose is to be obtained (FIG. 5).

As in the present embodiment, if a focal point position of the condenser lens 4 in a case where a relatively large electron dose is to be obtained is controlled to be located on the downstream side of the diaphragm 5, an opening angle at which the diaphragm 5 is oriented from a focal point position can be controlled to be smaller than in a case where a focal point position of the condenser lens 4 is located on the upstream side of the diaphragm 5. As a result, in the length measurement SEM of the present embodiment, the opening angle 31 of an electron beam with respect to the objective lens 10 can be controlled to be smaller than in a case where a focal point position of the condenser lens 4 is located on the upstream side of the diaphragm 5.

Meanwhile, in the above-described PTL 2, it is deemed that the circuit pattern inspection apparatus which locates a focal point of the condenser lens on the downstream side of the diaphragm 5 when a relatively large electron dose is to be obtained is disclosed, but a lens corresponding to the condenser lens 6 of the present embodiment is not disclosed. Thus, PTL 2 discloses that an objective opening angle increases in a case where a relatively large electron dose is to be obtained. The increase in the objective opening angle is a problem which is the same as the problem in the charged particle beam apparatus of the present embodiment PTL 2 does not disclose that object point positions of the objective lens are the same as each other in cases of a relatively large electron dose and a relatively small electron dose, and the control method disclosed in PTL 2 is clearly differentiated from, the control method for the charged particle beam, apparatus of the present embodiment.

Next, a description will be made of a positional relationship between the condenser lens 4 (first condenser lens) and the diaphragm 5 in the length measurement SEM of the present embodiment. In the present embodiment, the condenser lens 4 is located at a point of 50 mm, from the electron source, and the diaphragm 5 having a hole diameter of 50 μm is located at a point of 100 mm from the condenser lens 4. Hereinafter, a description will be made of optical trajectories of an electron beam in a comparative apparatus and the length measurement SEM of the present embodiment when a radiation angle current density of the electron source is controlled to be 20 μA/sr.

First, the comparative apparatus will be described. The comparative apparatus corresponds to a case where a focal point position of the condenser lens 4 is controlled to be located on the upstream side of the diaphragm 5. In a case where the radiation angle current density of the electron source is controlled to be 20 μA/sr, if an amount of an electron beam passing through the diaphragm 5 is made to be 10 pA, an opening angle of an electron beam in the electron source may be about 0.4 mrad, and each of a focal point position of the condenser lens 4 and an orientation angle of the diaphragm 5 is 0.5 mrad. In a case where an amount of an electron beam passing through the diaphragm 5 is made to be 1000 pA by controlling a focal point position of the condenser lens 4 to be located on the upstream side of the diaphragm 5 in a state in which the radiation angle current density is constant, an opening angle of an electron beam in the electron source is required to be about 4 mrad, and each of a focal point position of the condenser lens 4 and an orientation angle of the diaphragm 5 is required to be 2.2 mrad. In this case, if a focal point position of the condenser lens 6 is controlled to be constant regardless of an electron dose, an opening angle of the objective lens which is about 10 mrad at 10 pA increases to 30 mrad or more at 1000 pA.

On the other hand, in the length measurement SEM of the present embodiment, in a case where the radiation angle current density of the electron source is controlled to be 20 μA/sr, if an amount of an electron beam passing through the diaphragm 5 is made to be 1000 pA by controlling a focal point position of the condenser lens 4 to be located on the downstream side of the diaphragm 5, an opening angle of an electron beam in the electron source may be about 4 mrad (the same as in the above-described example), and each of a focal point position of the condenser lens 4 and an orientation angle of the diaphragm 5 is 1.7 mrad. In a case where a focal point position of the condenser lens 6 is controlled to be constant regardless of an electron dose, an opening angle of the objective lens which is about 10 mrad at 10 pA increases to about 14 mrad at 1000 pA, and thus an increase in an opening angle of an electron beam in the objective lens 10 can be suppressed by ½ or more compared with a case where a focal point position of the condenser lens 4 is controlled to be located on the upstream side.

Figure 6:
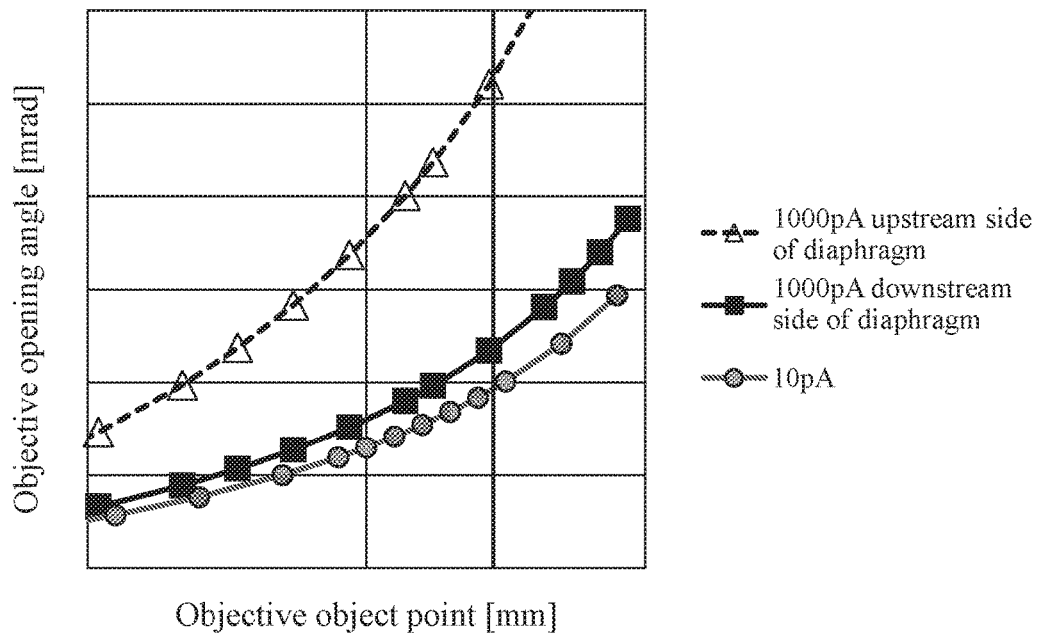
FIG. 6 is a diagram for explaining dependency of an objective opening angle on an objective object point.

With reference to FIG. 6, dependency of an objective opening angle on an objective object point will be described. An objective object point in the figure is a value indicated by converting a focal point position of the condenser lens 6 into an object point of the objective lens 10. A longitudinal solid line in FIG. 6 indicates respective desired objective object point positions. In FIG. 6, a relatively small electron dose is set to 10 pA, and a relatively large electron dose is set to 1000 pA. In a case where a focal point position of the condenser lens 4 is located on the upstream side of the diaphragm 5, it can be seen that an objective opening angle increases to twice or more at 1000 pA compared with 10 pA. On the other hand, in a case where a focal point position of the condenser lens 4 is located at the downstream side of the diaphragm 5, it can be seen that substantially the same control as in a case where an electron dose is 10 pA can be performed, and thus an increase in an objective opening angle can be suppressed.

Figure 7:
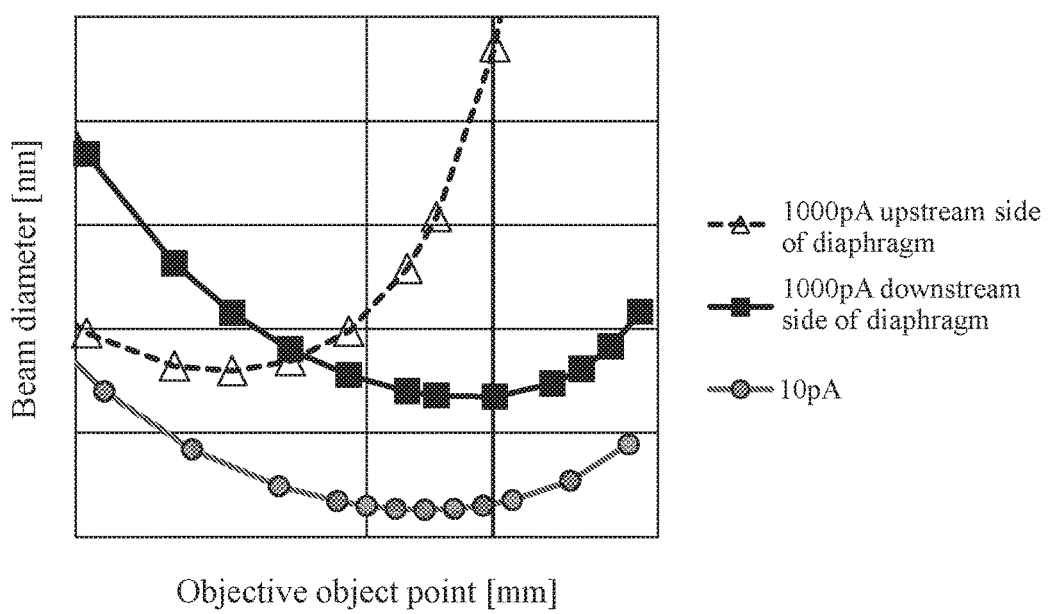
FIG. 7 is a diagram for explaining dependency of a beam diameter on an objective object point.

With reference to FIG. 7, dependency of an electron beam diameter on an objective object point will be described. A longitudinal solid line in FIG. 7 indicates respective desired objective object point positions. Also in FIG. 7, a relatively small electron dose is set to 10 pA, and a relatively large electron dose is set to 1000 pA. In a case where a focal point position of the condenser lens 4 is located on the upstream side of the diaphragm 5, it can be seen that a resolution increases to three times or more at 1000 pA compared with 10 pA. On the other hand, in a case where a focal point position of the condenser lens 4 is located at the downstream side of the diaphragm 5, it can be seen that an increase in a beam diameter can be suppressed by ⅓ or more. This is because an increase in a chromatic aberration of the objective lens which is proportional to the objective opening angle is suppressed.

The condenser lenses 4 and 6 and the objective lens 10 described in the present embodiment may be an electrostatic type lens formed of electrodes, may be an electromagnetic type lens formed of a coil and a magnetic body, and may be a composite type lens formed of both of the two types. The electrostatic type lens is characterized in terms of good responsiveness, and the electromagnetic type lens is characterized in terms of low aberration. The electron source may be not only a thermal field emission electron source, but also a field emission electron source allowing small energy distribution, and a heat radiation electron source which can be stably used even at a low degree of vacuum.

As mentioned above, if the length measurement SEM of the present embodiment is used, even in a case where inspection is performed with a relatively large electron dose, an objective opening angle equivalent to a case where the sample 12 is inspected with a relatively small electron dose can be realized, and thus it is possible to realize high S/N observation for a deep groove (particularly, a groove bottom) or improvement of throughput.

Second Embodiment

Figure 8:
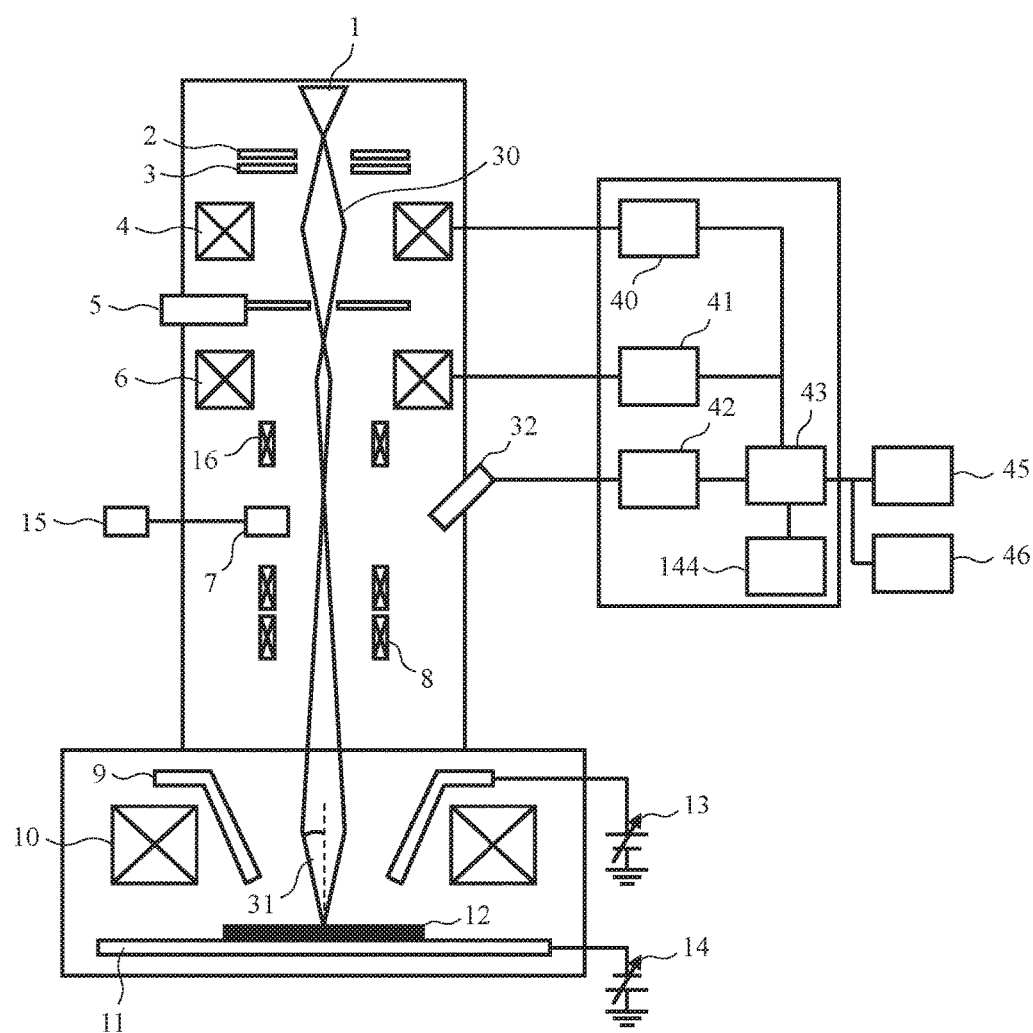
FIG. 8 is a diagram illustrating a schematic configuration of a charged particle beam apparatus according to a second embodiment.

With reference to FIG. 8, a description will be made of a schematic configuration of a length measurement SEM according to a second embodiment. In FIG. 8, the same reference numerals are given to portions corresponding to those in FIG. 1. Thus, repeated description of the portions given the same reference numerals will be omitted.

In the above-described first embodiment, a single relationship between control values of the condenser lens 4 and control values of the condenser lens 6 corresponding to an electron dose is stored in the storage device 44, but the present embodiment is different from the first embodiment in that an electron dose used during observation is stored in a storage device 144 in correlation with control values of the condenser lens 4 corresponding to each electron dose for each observation location on the sample 12. In this case, in the same manner as in the first embodiment, a control amount of the condenser lens 6 may be computed by assigning a control value of the condenser lens 4 to a function, and a corresponding control value of the condenser lens 6 may be retrieved and read on the basis of a control value of the condenser lens 4. A combination of control values of the condenser lens 4 and control values of the condenser lens 6, corresponding to each electron dose, may be stored.

Figure 9:
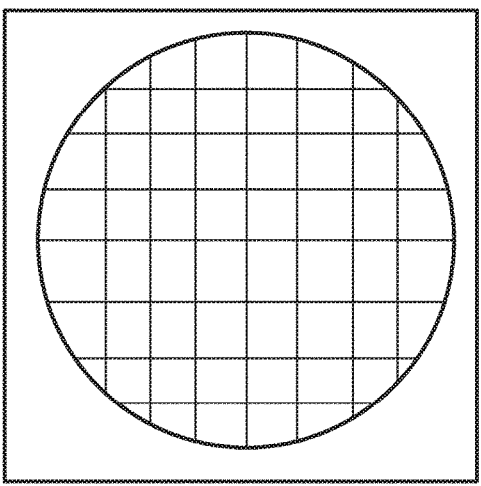
FIG. 9 is a diagram schematically illustrating an inspection recipe condition setting screen.

FIG. 9 illustrates a GUI of the image display unit 46 which displays inspection conditions for the sample 12. The length measurement SEM of the present embodiment has the GUI for designating two or more observation locations and an electron dose used for each observation location. Here, an electron dose may be designated from among two or more electron doses. A user inputs an electron dose to be used for each observation location via the input unit 45 by using the GUI before starting inspection of the sample 12. The input information is stored in the storage device 144 via the control/calculation unit 43. The storage device 144 stores a table in which two or more observation locations and two or more electron doses are correlated with each other.

If the length measurement SEM of the present embodiment is used, it is possible to perform inspection using two or more electron doses while using the same inspection recipe. In other words, it is possible to select an electron dose to be used for inspection for each circuit pattern in a single sample 12. In the sample 12 in which a height position of an observation location is not changed, observation can be performed without adjusting a focus of the objective lens 10 even if an electron dose is changed.

Third Embodiment

Figure 10:
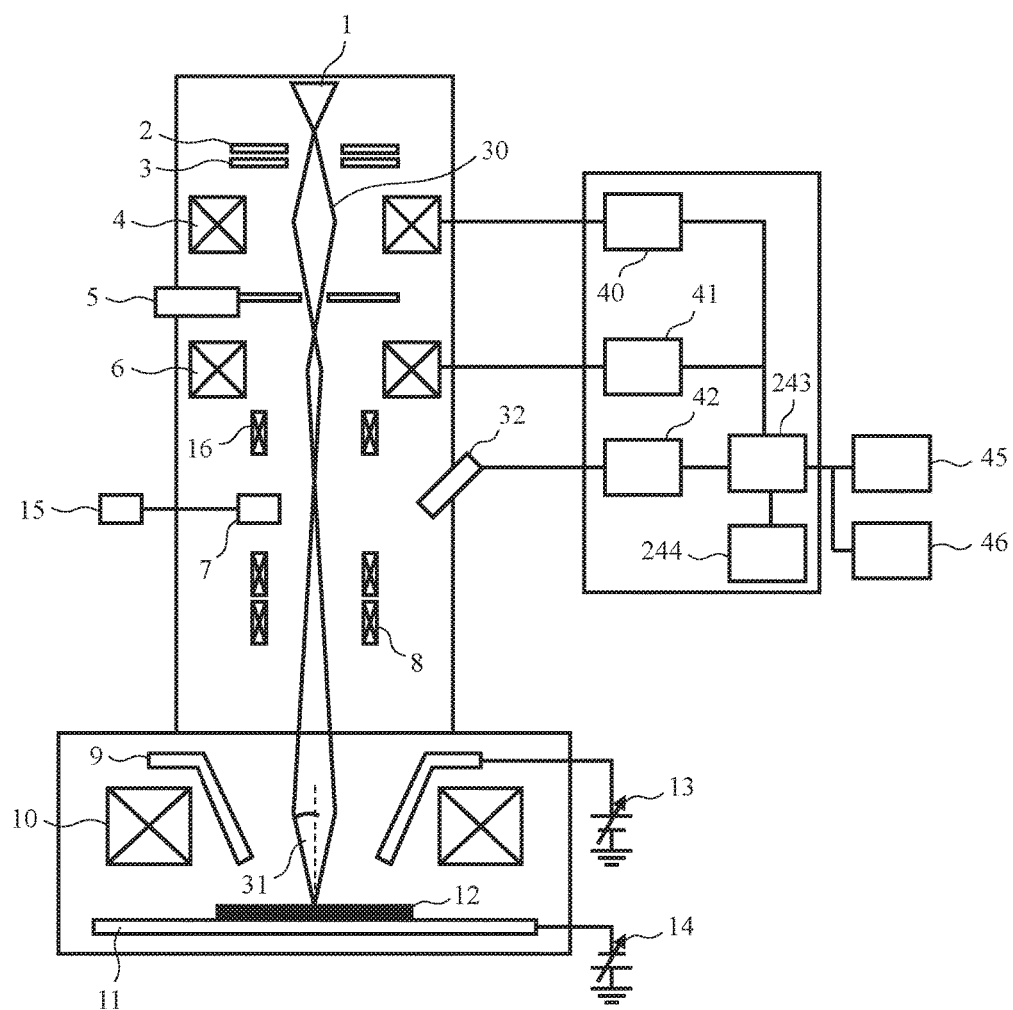
FIG. 10 is a diagram illustrating a schematic configuration of a charged particle beam apparatus according to a third embodiment.

With reference to FIG. 10, a description will be made of a schematic configuration of a length measurement SEM according to a third embodiment. In FIG. 10, the same reference numerals are given to portions corresponding to those in FIG. 1. Thus, repeated description of the portions given the same reference numerals will be omitted.

In the above-described first embodiment, a relationship between control values of the condenser lens 4 and control values of the condenser lens 6 is stored as a function or a table in the storage device 44, but, the present embodiment is different from the first embodiment in that a plurality of observation regions are set in a single observation image of a designated observation location on the sample 12, an electron dose used during observation is stored in a storage device 244 in correlation with control values of the condenser lens 4 corresponding to each electron dose for each observation region. Here, each observation region is designated by using coordinates (pixel position) in a single observation image.

FIG. 11 illustrates a GUI of the image display unit 46 which displays inspection conditions for the sample 12. The length measurement SEM of the present embodiment has the GUI for designating an electron dose used for each of two or more observation regions in a single observation image.

Here, an electron dose may be designated from among two or more electron doses. A user inputs an electron dose to be used for each observation region given at a pixel position via the input unit 45 by using the GUI before starting inspection of the sample 12. The input information is stored in the storage device 244 via the control/calculation unit 43. The storage device 244 stores a table in which two or more observation regions and two or more electron doses are correlated with each other. FIG. 11 illustrates the GUI for designating an electron dose for each observation region when three observation regions are designated in a single observation image.

Here, a description will be made of an operation of the length measurement SEM in a case where a circuit pattern having a three-dimensional structure is observed. In the present embodiment, an electron dose is controlled for each electron beam scanning position (an observation region or a partial region) in a single observation image (within the same visual field or within a range in which the scanning deflector 8 can perform scanning with an electron beam). For example, in the three-dimensional structure, a circuit pattern portion of an upper part (upper layer) is scanned with a relatively small electron beam, a circuit pattern portion of a lower part (lower layer) such as a groove bottom is scanned with a relatively large electron beam, and thus a SEM observation image is obtained.

The length measurement SEM of the present embodiment is provided with the storage device 244 which stores two or more SEM images obtained, by performing scanning with electron doses of different intensities; a control/calculation unit 243 which combines the two or more stored SEM images with each other so as to output as a single image (a single observation image), and the storage device 244 which stores the single image obtained through a calculation process.

If the length measurement SEM of the present embodiment is used, S/N is improved in a lower part (lower layer) of a circuit pattern, such as a groove bottom from which a secondary signal amount detected by the detector is relatively small, a difference from a secondary signal amount from an upper part (upper layer) of the circuit pattern is reduced, and thus visibility of the groove bottom can be improved. The scanning deflector is preferably an electrostatic type deflector which allows a faster response than that of an electromagnetic type deflector, and each of the condenser lens 4 and the condenser lens 6 is preferably an electrostatic type lens which allows a faster response than that of an electromagnetic type lens.

Fourth Embodiment

In the above-described embodiments, a description has been made of a case where control values of the condenser lens 4 are switched according to an electron dose, but the condenser lens 4 may be controlled by using a single control value regardless of an electron dose, and only control values of the condenser lens 6 on the downstream side may be controlled to be switched according to an electron dose. In this case, the storage devices 44, 144 and 244 may store a control value of the condenser lens 4 which is common to a plurality of electron doses, and control values of the condenser lens 6 corresponding to the electron doses. Also in a case of this control method, if the above-described condition regarding an optical trajectory of an electron beam is satisfied, the same effect as in each embodiment can be achieved.

Other Embodiments

The invention is not limited to the above-described embodiments, and includes various modification examples. For example, the above-described embodiments have been described in detail for better understanding of the invention, and are not limited to including all the above-described configurations. Some configurations of a certain embodiment may be replaced with configurations of other embodiments, and configurations of other embodiments may be added to configurations of a certain embodiment. The configurations of other embodiments may be added to, deleted from, and replaced with some of the configurations of each embodiment.

REFERENCE SIGNS LIST

1 charged particle source
2 extraction electrode
3 acceleration electrode
4 condenser lens
5 diaphragm
6 condenser lens
7 faraday cup
8 scanning deflector
9 upper magnetic pole
10 objective lens
11 sample stand
12 sample
13 voltage power source
14 voltage power source
15 ammeter
16 deflector
30 charged particle beam
32 secondary signal detector
40 lens setting unit
41 lens setting unit
42 signal processing unit
43 control/calculation unit
44 storage device
45 input unit
46 image display unit
144 storage device
244 storage device

The invention claimed is:
1. A charged particle beam apparatus comprising:
a charged particle source;
a first condenser lens that is provided on a downstream side of the charged particle source;
a diaphragm that is provided on a downstream side of the first condenser lens;
a second condenser lens that is provided on a downstream side of the diaphragm;
an objective lens that is provided on a downstream side of the second condenser lens;
a detector that detects an information signal generated from a sample due to irradiation with a charged particle beam; and
a controller that controls the first and second condenser lenses so that a charged particle beam is imaged on the downstream side of the diaphragm in a case where the sample is irradiated with a second charged particle dose larger than a first charged particle dose, and a focal point position of the second condenser lens is not changed at the first charged particle dose and the second charged particle dose.

2. The charged particle beam apparatus according to claim 1,
wherein the controller controls the first condenser lens so that a charged particle beam is imaged on an upstream side of the diaphragm in a case where the sample is irradiated with the first charged particle dose.

3. The charged particle beam apparatus according to claim 1,
wherein the controller obtains a control value of the second condenser lens through computation according to a control value of the first condenser lens.

4. The charged particle beam apparatus according to claim 1,
wherein the controller obtains a control value of the second condenser lens corresponding to a control value of the first condenser lens by retrieving a table in which a correspondence relationship between the control value of the first condenser lens and the control value of the second condenser lens is stored.

5. The charged particle beam apparatus according to claim 1,
wherein the controller obtains a control value of the first condenser lens and a control value of the second condenser lens on the basis of a charged particle dose or an optical mode to be used.

6. The charged particle beam apparatus according to claim 1,
wherein the controller controls the first condenser lens by using a control value corresponding to a charged particle dose or an optical mode to be used.

7. The charged particle beam apparatus according to claim 1,
wherein the controller controls the first condenser lens by using a control value which is common to a plurality of charged particle doses or optical modes, and controls the second condenser lens by using a control value corresponding to a charged particle dose or an optical mode to be used.

8. The charged particle beam apparatus according to claim 1,
wherein, in a case where the sample is irradiated with the second charged particle dose, the controller controls the first and second condenser lenses so as to suppress an increase in an opening angle of a charged particle beam applied to the sample.

9. The charged particle beam apparatus according to claim 1,
wherein the controller displays, on a screen, an input column for individually designating an electron dose used for observation for each of two or more observation locations in the sample.

10. The charged particle beam apparatus according to claim 1,
wherein the controller displays, on a screen, an input column for individually designating an electron dose used for observation for each of two or more partial regions in the same visual field.

11. An inspection method for a charged particle beam apparatus including a charged particle source; a first condenser lens that is provided on a downstream side of the charged particle source; a diaphragm that is provided on a downstream side of the first condenser lens; a second condenser lens that is provided on a downstream side of the diaphragm; an objective lens that is provided on a downstream side of the second condenser lens; a detector that detects an information signal generated from a sample due to irradiation with a charged particle beam; and a controller, the method comprising:
causing the controller to perform process of controlling the first and second condenser lenses so that a charged particle beam is imaged on the downstream side of the diaphragm in a case where the sample is irradiated with a second charged particle dose larger than a first charged particle dose, and a focal point position of the second condenser lens is not changed at the first charged particle dose and the second charged particle dose.

12. The inspection method according to claim 11,
wherein a process of controlling the first condenser lens is performed so that a charged particle beam is imaged on an upstream side of the diaphragm in a case where the sample is irradiated with the first charged particle dose.

13. The inspection method according to claim 11,
wherein, in a case where the sample is irradiated with the second charged particle dose, a process of controlling the first and second condenser lenses is performed so that an increase in an opening angle of a charged particle beam applied to the sample is suppressed.

14. The inspection method according to claim 11,
wherein a process of displaying, on a screen, an input column for individually designating an electron dose used for observation for each of two or more observation locations in the sample, is performed.

15. The inspection method according to claim 11,
wherein a process of displaying, on a screen, an input column for individually designating an electron dose used for observation for each of two or more partial regions in the same visual field, is performed.

* * * * *